(12) United States Patent
Hogan et al.

(10) Patent No.: US 6,648,693 B1
(45) Date of Patent: Nov. 18, 2003

(54) GUIDE RAIL AND CAM SYSTEM WITH INTEGRATED LOCK-DOWN AND KICK-OUT SPRING FOR SMT CONNECTOR FOR PLUGGABLE MODULES

(75) Inventors: William K. Hogan, Rochester, MN (US); David Peter Gaio, Rochester, MN (US); Frank Ovanessians, Gahanna, OH (US); Scott Michael Branch, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/391,974

(22) Filed: Sep. 8, 1999

Related U.S. Application Data

(63) Continuation-in-part of application No. 09/216,104, filed on Dec. 18, 1998, now Pat. No. 6,074,228.

(51) Int. Cl.$^7$ ................................................ H01R 24/00
(52) U.S. Cl. ...................................... 439/630; 439/923
(58) Field of Search .......................... 439/180, 66, 630, 439/260, 76.1, 923; 455/603; 385/75; 359/163; 361/686

(56) References Cited

U.S. PATENT DOCUMENTS

| | | | |
|---|---|---|---|
| 4,809,360 A | 2/1989 | Kraft ........................ 455/603 |
| 4,821,147 A * | 4/1989 | Jacobs et al. ................ 361/707 |
| 5,125,846 A | 6/1992 | Sampson et al. .............. 439/66 |
| 5,181,852 A | 1/1993 | Dambach et al. ............. 439/52 |
| 5,227,957 A * | 7/1993 | Deters ........................ 361/395 |
| 5,647,042 A | 7/1997 | Ochiai et al. ................. 385/56 |
| 5,682,277 A * | 10/1997 | Hanson .................... 360/97.01 |
| 5,694,292 A * | 12/1997 | Paulsel et al. .............. 361/686 |
| 5,757,998 A | 5/1998 | Thatcher et al. .............. 385/75 |
| 5,767,999 A * | 6/1998 | Kayner ....................... 359/163 |

* cited by examiner

Primary Examiner—Neil Abrams
Assistant Examiner—Michael C. Zarroli
(74) Attorney, Agent, or Firm—Matthew J. Bussan; James R. Nock; Leslie J. Payne

(57) ABSTRACT

An electrical connector system has two connectors, one of which is included in a module mateable with the other connector in a pluggable manner. The other connector includes a body and two or more electrical contacts. The body of that electrical connector includes a spring that provides a combined lock-down force and kick-out force. The lock-down force biases the module against the other connector, thereby providing a secure electrical and mechanical connection. The kick-out force biases the module away from the other connector to separate or eject the module when a user actuates a release mechanism. The module also includes a slot that engages a projection on the other connector to promote alignment of the mating electrical contacts.

17 Claims, 11 Drawing Sheets

GUIDE RAIL AND CAM SYSTEM WITH INTEGRATED LOCK-DOWN AND KICK-OUT SPRING FOR SMT CONNECTOR FOR PLUGGABLE MODULES

CROSS-REFERENCE TO RELATED APPLICATION

This is a continuation-in-part of application Ser. No. 09/216,104, filed Dec. 18, 1998, now U.S. Pat. No. 6,074, 228, issued Jun. 13, 2000 entitled "GUIDE RAIL AND CAM SYSTEM WITH INTEGRATED CONNECTOR FOR REMOVABLE TRANSCEIVER," incorporated herein in its entirety by this reference.

BACKGROUND OF THE INVENTION

1. Field of the Invention

The present invention relates generally to electronic connector systems and, more specifically, to low-profile connector systems for user-removable electronic modules, such as transceiver modules that interface with a peripheral device port of a portable computer.

2. Description of the Related Art

Electrical connectors are used to interconnect circuit cards and other electronic modules or assemblies. A connector commonly used in personal computer systems is known as a D-shell connector because the contact pins of the male connector and female connector are enclosed within generally D-shaped structures that mate to promote a secure mechanical connection as well as provide electromagnetic shielding. In a D-shell connector, contact pins of the male connector are frictionally received in contact holes of the female connector. The wiping action between the pins and holes minimizes the buildup of oxides or dirt that could impede electrical conduction. Connectors that have wiping mating parts define one of a number of general categories of connectors.

Another general category of connectors is defined by those connectors that have abutting mating parts. One such connector, illustrated in FIG. 1A, is known as the J-lead connector (10) because the electrical contacts 12 are generally J-shaped. A J-lead connector 10 is typically used to interconnect two circuit cards 14 and 16 that are disposed in a back-to-back orientation. The J-lead connector 10 is mounted on one of the circuit cards, typically by soldering one end of each contact 12 to a surface-mount pad (not shown) on the circuit card. The shape of contacts 12 provides some resiliency or springiness, and when circuit cards 14 and 16 are brought together, as illustrated in FIG. 1B, pads (not shown) on circuit card 16 make electrical and mechanical contact with contacts 12 of circuit card 16. Contacts 12 are deflected slightly, and the spring force exerted by the deflected contacts 12 against the contact pads promotes good electrical connection.

Various international and industry standards define the type of connectors used to interface personal computers to external communication devices such as modems, network interfaces, and other transceivers. A well-known type of transceiver developed by an industry consortium and known as a gigabit interface converter (GBIC) or serial optical converter (SOC) provides an interface between a computer and an Ethernet, Fibre Channel or other data communication environment. The D-shell connectors of such transceivers mate with a complementary D-shell connector mounted on the circuit card of the host computer.

It is desirable to miniaturize transceivers in order to increase the port density associated with the network connection (switch boxes, cabling patch panels, wiring closets, computer I/O, etc.). Various standards are known that define form factors for miniaturized electronic devices, such as the Small Form Factor (SFF) standard, which specifies an enclosure 9.8 mm in height by 13.5 mm in width and having a minimum of 24 electrical input/output connections.

Miniaturizing a transceiver, however, raises a number of potential connector problems. Among these problems is mechanically coupling the connectors in a manner that biases the contacts of one connector against those of the mating connector to provide a secure electrical connection. Another problem is releasing the connectors from one another in a manner that is convenient to the user and that minimizes stress on the electrical contacts. Still another problem relates to aligning the contacts of one connector with respect to those of the mating connector. These problems and deficiencies are satisfied by the present invention in the manner described below.

SUMMARY OF THE INVENTION

The present invention relates to an electrical connector system having two connectors in which one of the connectors is included in a module mateable with the other connector in a pluggable manner. The other connector includes a body and two or more electrical contacts. In accordance with one aspect of the invention, the body of that electrical connector includes a spring that provides a combined lock-down force and kick-out force. The lock-down force biases the module against the other connector, thereby providing a secure electrical and mechanical connection. The kick-out force biases the module away from the other connector to separate or eject the module when a user actuates a release mechanism. In accordance with another aspect of the invention, the module includes a slot that engages a projection on the other connector to promote alignment of the mating electrical contacts.

The body of module connector is definable by three mutually perpendicular axes and has a connector block. The body, including the connector block, has a very low profile, and in certain exemplary embodiments it is preferably less than about 10 mm in height, i.e., the dimension defined by the third axis, to accommodate the Small Form Factor standard and to facilitate surface-mounting the bottom of the body on a circuit board. The connector block retains the contacts, which are spaced from one another in the direction of the first axis. One of the connectors includes a guide rail to facilitate mechanical mating of the connectors. In an exemplary embodiment, the connector block is at one end of the guide rail, which is elongated between a first end and second end of the body along the first axis. One of the connectors also includes a camming element that, in response to a force of a mating connector being moved along the first axis, redirects the force in a direction having a component along the third axis so as to cause relative motion and resulting electrical contact between the contacts of the electrical connector and the contacts of the mating connector. In an exemplary embodiment, the camming element is a cam on the connector block having two oppositely inclined ramp sections. When a mating connector having complementary contacts is, guided by the guide member, moved into initial engagement with the cam, the first ramp lifts the mating connector, including its contacts, above the connector block. When the mating connector is moved further into engagement with the cam, the second ramp lowers the mating connector onto the connector block, with the contacts of the mating connector lowering onto and making contact with the contacts of the electrical connector. The camming motion minimizes wiping between the mating contacts. In addition, the contacts of the electrical connector are preferably somewhat resiliently deflectable to promote good electrical contact.

The electrical contacts may be arrayed in two or more rows, each parallel to the second axis and having two or more contacts.

In an exemplary embodiment, the mating electrical connector that mates with the electrical connector having the body and connector block is included in an optical transceiver module. Nevertheless, the connector system may be used in other arrangements and to couple other types of electronic modules or assemblies.

The foregoing, together with other features and advantages of the present invention, will become more apparent when referring to the following specification, claims, and accompanying drawings.

BRIEF DESCRIPTION OF THE DRAWINGS

For a more complete understanding of the present invention, reference is now made to the following detailed description of the embodiments illustrated in the accompanying drawings, wherein.

DESCRIPTION OF PREFERRED EMBODIMENTS

Figure 1A:
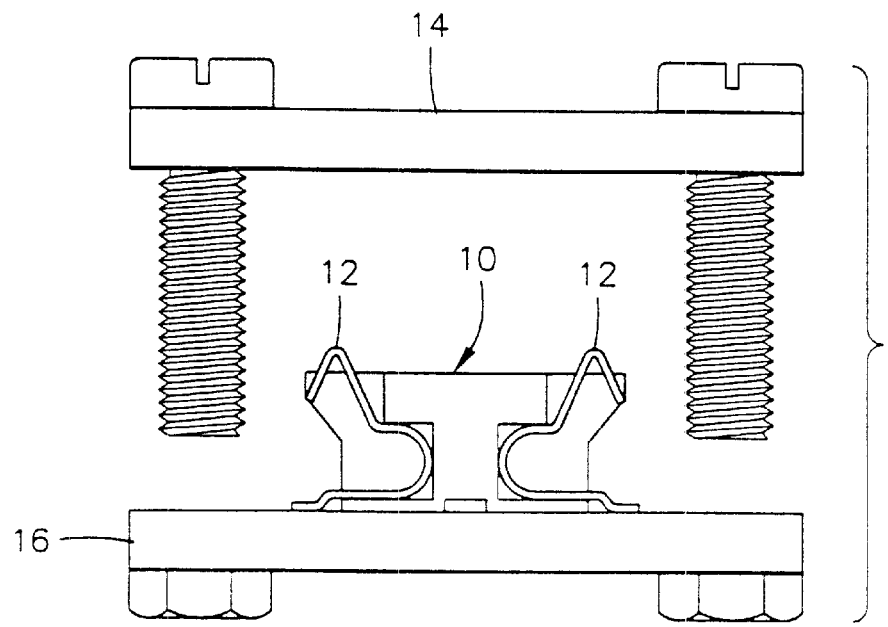
FIG. 1A is an end view of a prior art J-lead connector for coupling two circuit boards.
Figure 1B:
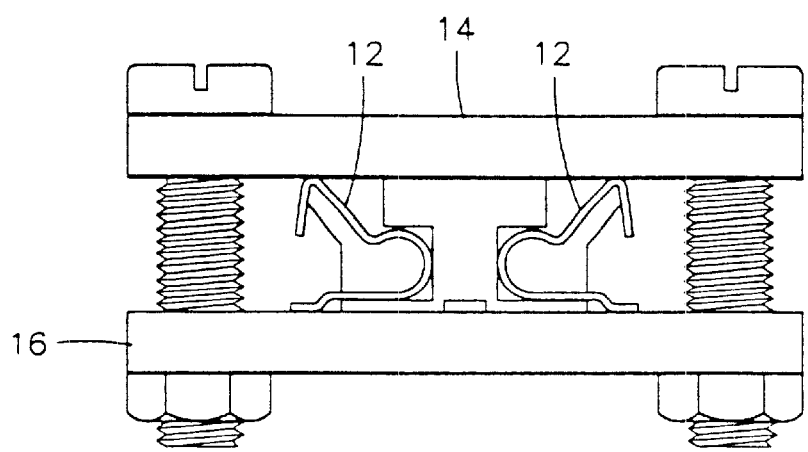
FIG. 1B is similar to FIG. 1A and illustrates the completion of electrical contact between the circuit boards using the J-lead connector.
Figure 2:
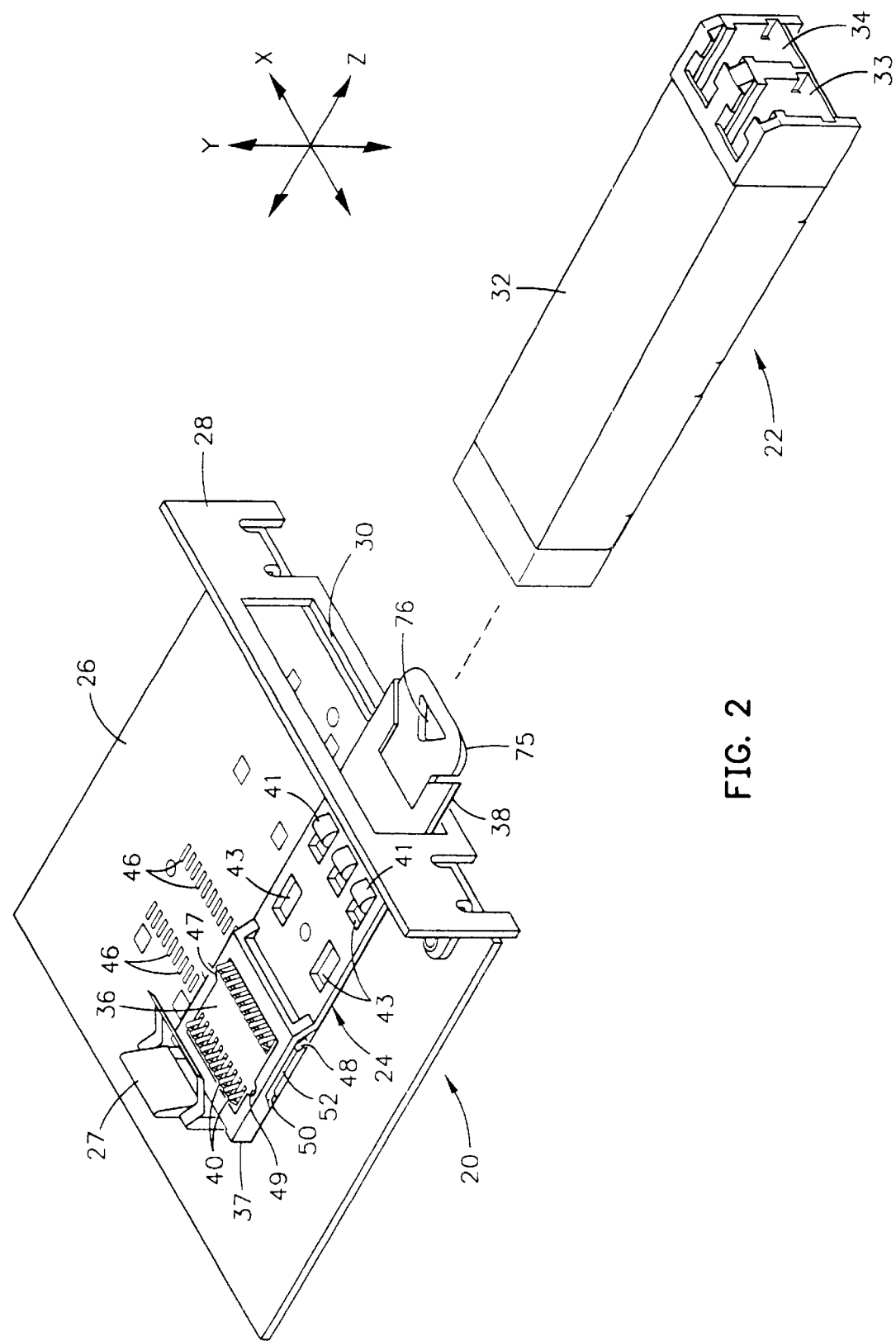
FIG. 2 is a perspective view of the connector system, showing an electronic assembly having a camming connector mateable with a transceiver module.
Figures 9, 10:
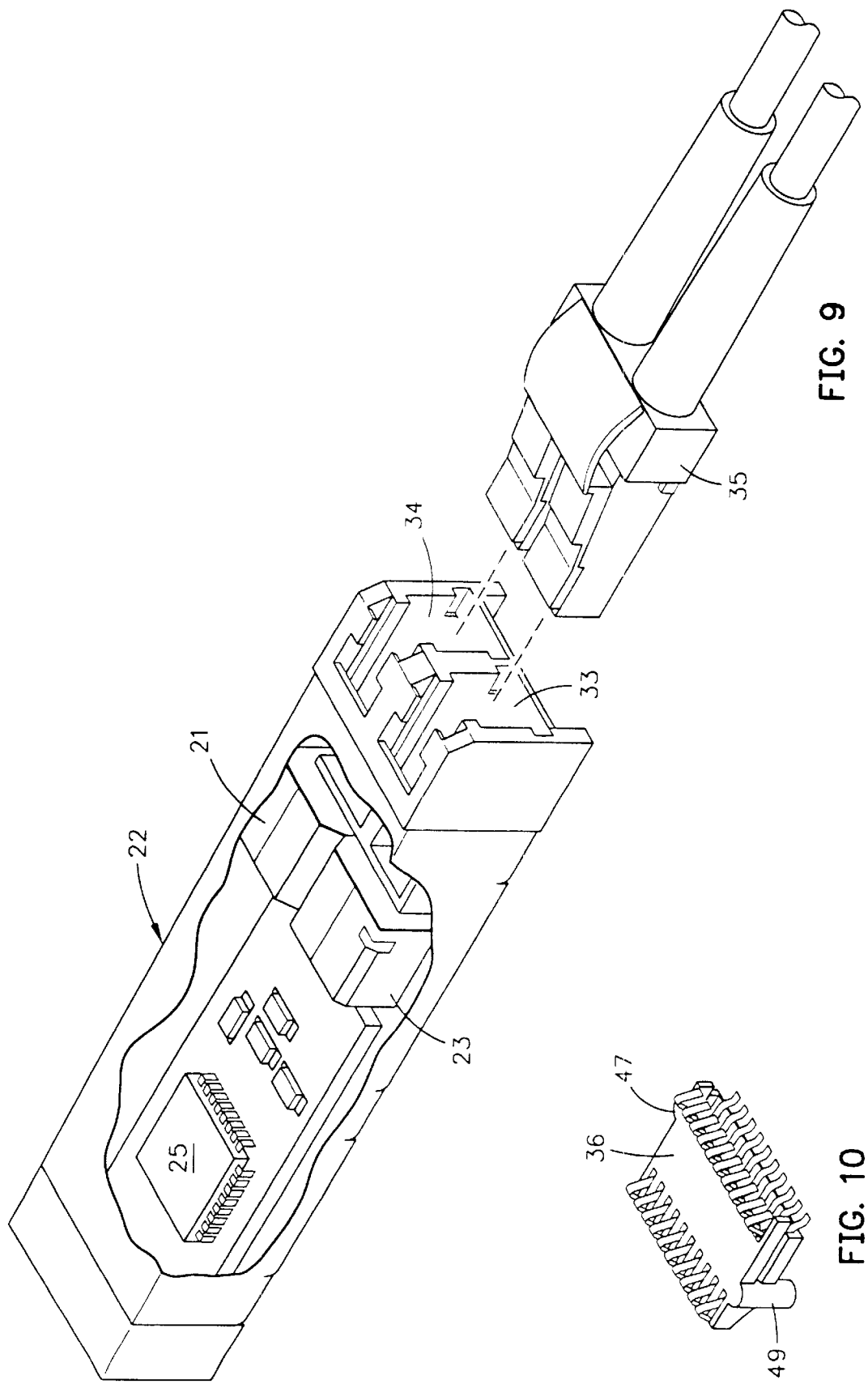
FIG. 9 is a perspective view of the transceiver module, partially cut away to show the transceiver circuitry, illustrating the transceiver module mating with an optical cable.
FIG. 10 is a perspective view of the connector block portion of the camming connector.
Figure 11:
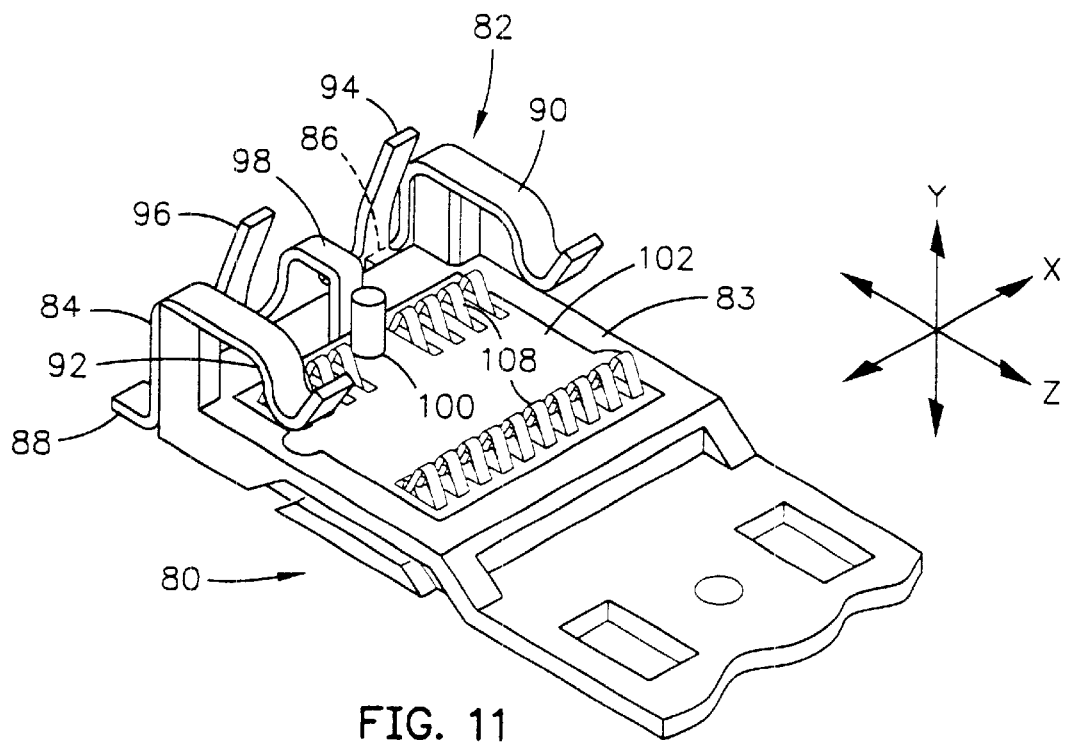
FIG. 11 is a partial perspective view of an alternative camming connector having a combined lock-down and kick-out spring clip.

As illustrated in FIG. 2, a peripheral device port assembly 20 for a personal computer or similar device (not shown) is electrically and mechanically mateable with a data transceiver module 22. Transceiver module 22 is preferably of the GBIC or SOC type and, as illustrated in FIG. 9, includes suitable optical transceiver electronics, such as a laser photodiode-based transmitter 21, a photodetector-based receiver 23, and suitable integrated circuit chips 25 that contain laser driver preamplifiers and other circuitry of the type conventionally included in optoelectronic transceivers. Module 22 receives and transmits serial optical data and serial electrical data, although parallel optical and/or parallel electrical transmission and reception is also contemplated within the realm of this invention. Module 22 communicates electrical signals to and from peripheral device port assembly 20 using the electrical connector system described below.

Assembly 20 includes a camming electrical connector 24 surface-mounted as described in further detail below on a printed circuit board 26. A spring clip 27 is also surface-mounted on circuit board 26. Assembly 20 also includes a bracket 28 mounted perpendicularly to circuit board 26. Bracket 28 has a rectangular opening 30 with substantially industry-standard dimensions that facilitate receiving a circuit card module (not shown) conforming to the PCMCIA standard. In use, assembly 20 can be mounted in an orientation with bracket 28 parallel to and abutting a wall of a computer enclosure having a correspondingly dimensioned opening. Because the novel connector system of the present invention is mateable through a port opening 30 having standard PCMCIA dimensions, connector 24 of the system can be mounted on an essentially standard peripheral device port assembly 20. In other words, computer device manufacturers can readily adapt their existing assemblies of this type to include the novel connector system of the present invention in place of conventional connector systems, such as those that use D-shell connectors.

A particular advantage of the connector system of the present invention, however, is that module 22 can conform to the Small Form Factor (SFF) standard. In accordance with the SFF standard, module 22 preferably has an enclosure 32 that is less than 9.8 mm in height and 13.5 mm in width. Accordingly, opening 30 has a height less than 9.8 mm to facilitate insertion of module 22 through it. As used in this patent specification, the term "width" refers to the dimension or axis labeled "X" in FIG. 2, and the term "height" refers to the dimension or axis labeled "Y" in FIG. 2. In view of the increasing desire in the industry to miniaturize communication transceivers in order to increase port density, it has been suggested that newer transceivers that conform to the SFF standard have connectors that resemble a standard RJ-45 telephone jack, which is about 13.5 mm wide. Module 22 has optical input and output connectors 33 and 34 that, as illustrated in FIG. 9, are optically and mechanically mateable with an optical cable connector assembly 35. Module 22 thus receives serial optical signals at one end from optical cable connector assembly 35, converts them to electrical signals, and provides the electrical signals at the other end to assembly 20. Likewise, module 22 receives serial electrical signals at one end from assembly 20, converts them to optical signals, and provides the optical signals at the other end to optical cable connector assembly 35.

Figure 3:
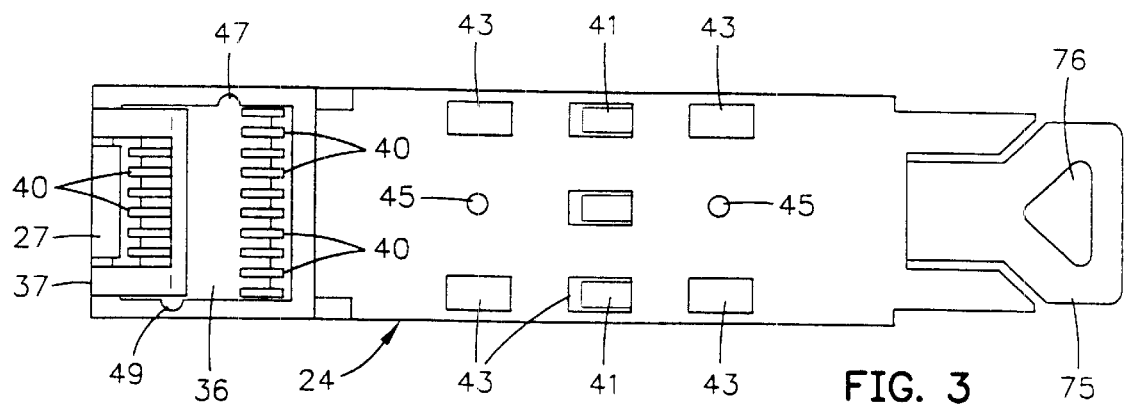
FIG. 3 is a top plan view of the camming connector.
Figure 4:
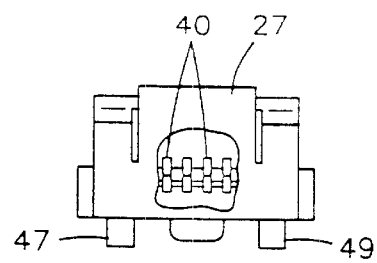
FIG. 4 is an end view of the camming connector.
Figure 5:
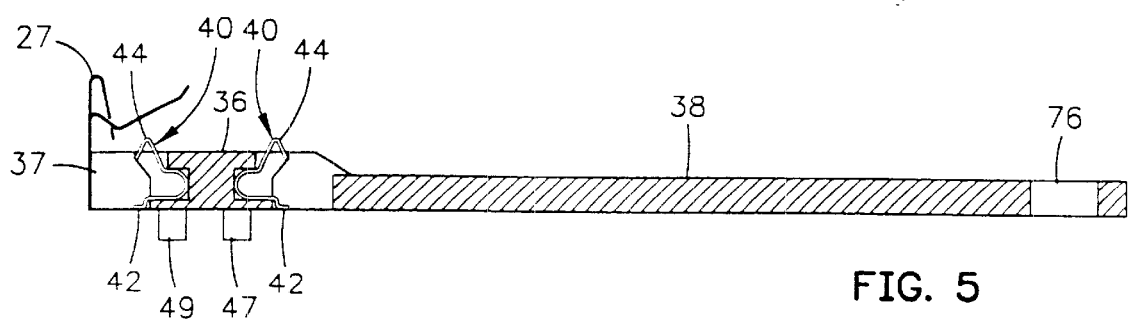
FIG. 5 is a sectional view of the camming connector.
Figure 6A:
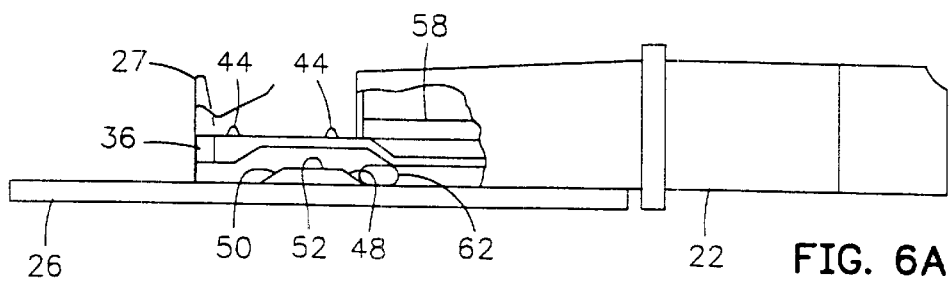
FIG. 6A illustrates the beginning of the mating action between the camming connector and the transceiver module.
Figure 6B:
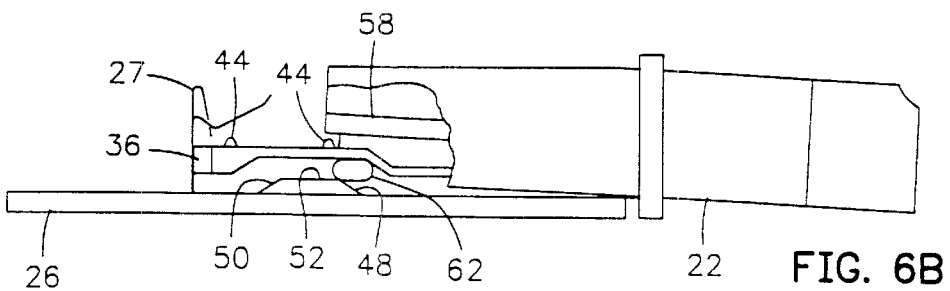
FIG. 6B is similar to FIG. 6A and illustrates further progression in the mating action.
Figure 6C:
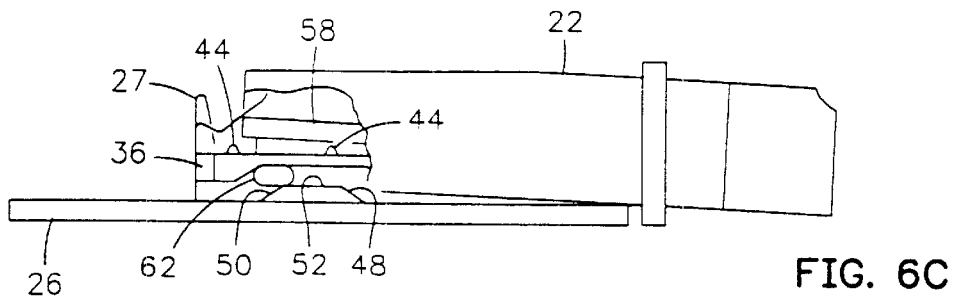
FIG. 6C is similar to FIGS. 6A–B and illustrates still further progression in the mating action.
Figure 6D:
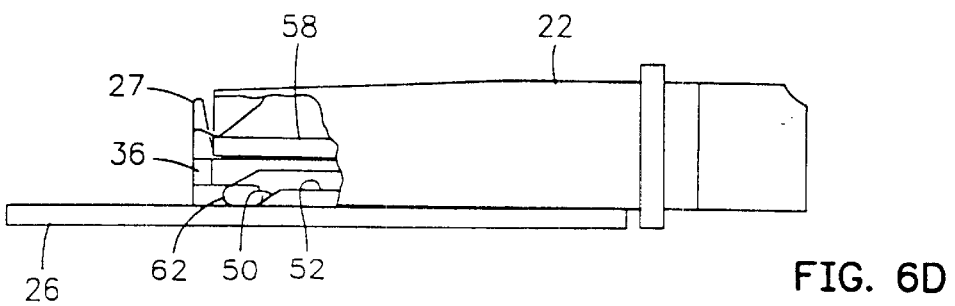
FIG. 6D is similar to FIGS. 6A–C and illustrates yet further progression in the mating action.
Figure 6E:
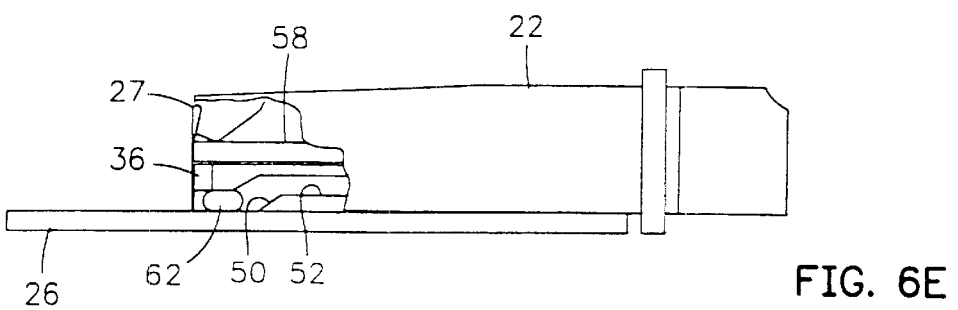
FIG. 6E is similar to FIGS. 6A–E and illustrates the end of the mating action, with the contacts fully mated.

With further reference to FIGS. 3–5, connector 24 includes a connector block 36 and an elongated, flat or tongue-shaped guide rail 38. Connector 24 may comprise any suitable number of parts. Preferably, connector block 36 is a separate part, illustrated in FIG. 10, that fits within a rectangular opening in a camming block 37 at one end of guide rail 38. Connector block 36 has two pins 47 and 49 that extend from its lower surface to facilitate mounting it to circuit board 26. This structure promotes manufacturability by allowing connector block 36 to be mounted to circuit board 26 and the electrical connections described below made by solder processes prior to mounting guide rail 38 to circuit board 26. Guide rail 38 is elongated in the dimension or axis labeled "Z" in FIG. 2. Connector 24, including connector block 36 and guide rail 38, is preferably no wider than about 12 mm. This miniaturization allows two or more such connectors 24 to be mounted side-by-side in a standard PCMCIA-width opening 30 to increase port density.

Two (or more in other embodiments) rows of electrical contacts 40 oriented in the X direction are mounted in connector block 36. Electrical contacts 40 are of the conventional J-lead type. That is, each contact 40 is a wire-like or strip-like member having a surface-mountable lower portion 42 connected via a generally U-shaped or J-shaped bend to an upper portion 44 that is somewhat resiliently deflectable with respect to lower portion 42. Lower portion 42 of each contact 40 is essentially flush with the lower surface of connector block 36, protruding only slightly to facilitate surface-mounting to pads 46 of circuit board 26. Circuit board 26 may comprise any suitable type of rigid or flexible printed circuit substrate, and conventional solder reflow processes can be used to surface-mount contacts 40. Upper portion 44 of each contact 40 protrudes slightly from the upper surface of connector block 36 to facilitate electrical contact, as described below. The upper surface of connector block 36 is substantially planar, and the plane defined by upper portions 44 collectively is substantially parallel to the lower surface of connector block 36. The upper and lower surfaces of connector block 36 and guide rail 38 are all mutually parallel and, when connector 24 is mounted on circuit board 26, are parallel to circuit board 26 as well.

Electrical coupling between connector 24 and surface-mount pads of circuit board 26 is achieved through, in addition to contacts 40, a grounding strip having three upper contact portions 41. Upper contact portions 41 protrude through three of the seven apertures 43 in guide rail 38 a sufficient distance above the upper surface of guide rail 38 to resiliently contact mating grounding contacts (not shown) inside module 22. The grounding strip has seven lower contact portions (not shown) that protrude through all seven apertures 43 sufficiently to surface-mount them to pads on circuit board 26 on which a signal at ground potential would exist during operation of the system. Although the contemplated purpose of contact portions 41 is grounding, in other embodiments of the invention such secondary contacts may be used for communication of other types of signals. Two holes 45 through guide rail 38 and a pin (not shown) extending perpendicularly from the lower surface of guide rail 38 facilitate mounting connector 24 on circuit board 26.

Connector 24 has a cam defined by two oppositely inclined ramps 48 and 50, having lower ends substantially level with the lower surface of connector 24 and upper ends coupled together via a flat region 52, i.e., a portion parallel to the upper and lower surfaces of connector 24. Ramps 48 and 50 may each be inclined at any suitable acute angle with respect to these surfaces, and the angles can be complementary or entirely different. Connector block 36 has indented portions shaped correspondingly to ramps 48 and 50 and region 52. In view of the corresponding ramp and indentation features, the cam can be described another way as having a groove with two portions inclined at generally opposing angles connected by a flat portion. Although in the illustrated embodiment of the invention the camming element is a cam having the above-described structure, other embodiments may have alternative cam mechanisms or other suitable types of camming elements.

Figure 7:
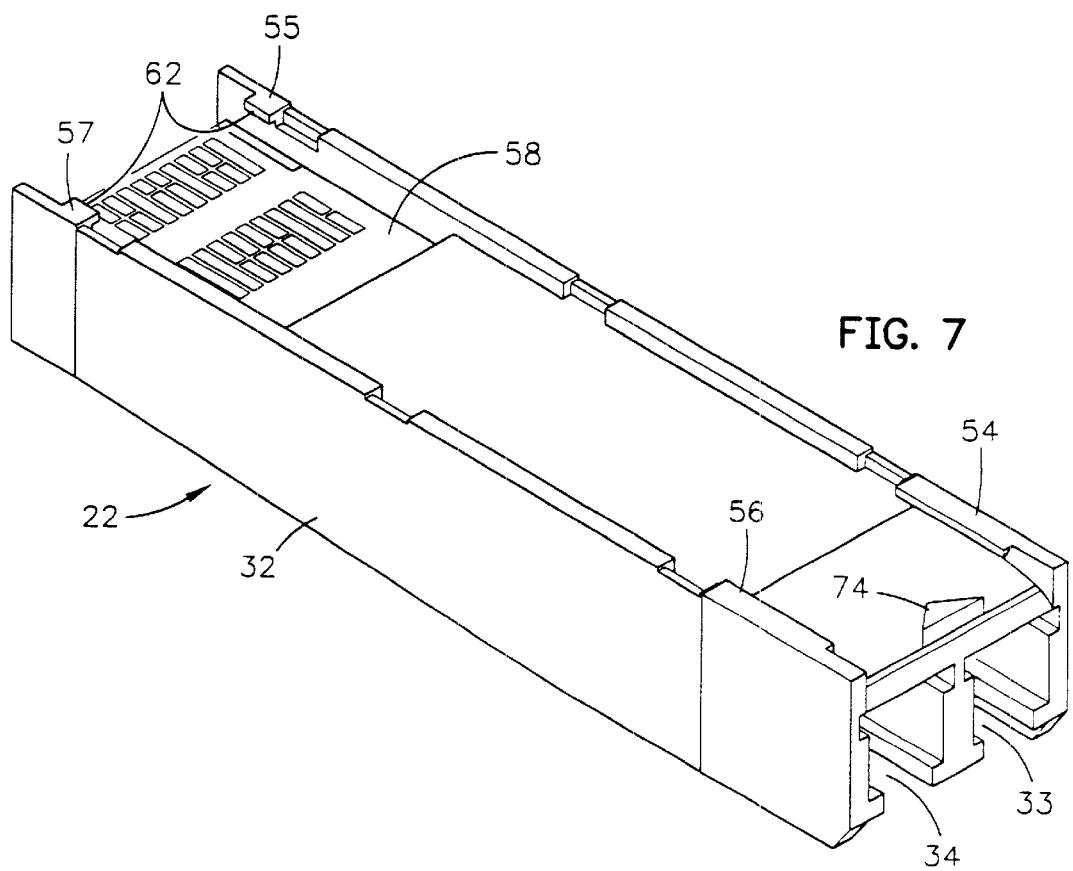
FIG. 7 is a perspective view showing the bottom of the transceiver module.

To use the connector system, a user engages the forward end of module 22 on guide rail 38. As illustrated in FIG. 7, flanges 54, 55, 56 and 57 on the lower edges of the side walls of enclosure 32 define channels in which guide rail 38 fits closely. Thus, module 22 is guided by guide rail 38 as the user continues to slide module 22 in the direction of connector block 24, i.e., in the Z direction. In this orientation, flanges 54–57 are substantially parallel to circuit board 26 and may slide upon its surface to some extent.

Figure 8:
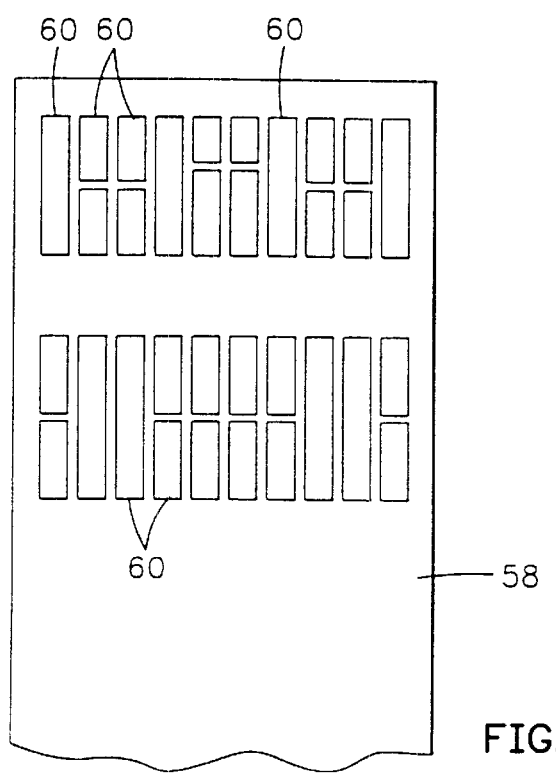
FIG. 8 is a top plan view of the contact pads of the transceiver module circuit board.

As illustrated in FIGS. 6A–6E, illustrating this mating action, module 22 has an internal circuit board 58 that is substantially parallel to edges 54 and 56. As illustrated in FIG. 8, the lower surface of circuit board 58 has electrical contact pads 60. Contact pads 60 are arranged in a complementary manner with respect to contacts 40 in connector block 36. In other words, the position of each contact pad 60 on circuit board 58 mirrors the position of a contact 40 in connector block 36. Contact pads 60 are preferably of different lengths to provide a signal connection sequencing function when electrical contact is made, as described below.

When the forward end of module 22 reaches connector block 36, the cam-follower projections 62 of flanges 55 and 57 travel in or follow the cam groove. Initially, they engage the lower ends of ramps 48. Ramps 48 redirect to the Y direction a portion of the force they experience in the Z direction. Projections 62 thus ride up ramps 48 (i.e., partially in the Y direction and partially in the Z direction), lifting forward end of module 22 and with it circuit board 58. When projections 62 reach the upper ends of ramps 48 in response to continued force applied by the user in the Z direction, they move onto flat regions 52. When projections 62 reach the other end of flat regions 52, they ride down ramps 50 in a similar manner (i.e., partially in the Y direction and partially in the Z direction). The groove walls that are complementary to ramps 48 redirect to the Y direction a portion of the force they experience in the Z direction. As projections 62 move downwardly, circuit board 58 descends toward the upper surface of connector block 36. As circuit board 58 descends, contact pads 60 of circuit board 58 make contact with upper portions 44 of contacts 40, deflecting them slightly in the Y direction. Also, as module 22 nears the end of its travel, spring clip 27 engages the upper surface of circuit board 58 and makes contact with a grounding contact pad (not shown) thereon. Spring clip 27 is deflected slightly by circuit board 58, and resiliently biases circuit board 58 downwardly to further mechanically secure module 22 to connector 24 while providing an additional path for coupling module 22 to the ground potential of assembly 20.

Although the majority of the relative movement that occurs between contact pads 60 and upper portions 44 immediately before they make contact is in the Y direction, a small amount of wiping, i.e., relative movement in the Z direction while in contact with one another, does occur. This small amount of wiping is beneficial because it cleans the contacting surfaces of oxides and dirt, thereby promoting good electrical contact. Nevertheless, to minimize wear, contacts 40 may be made of a gold-plated nickel-palladium alloy. Such electrical contact compositions are well-known to persons skilled in the art to which the invention pertains.

The small amount of wiping can also be used advantageously to sequence electrical signal connections and allow hot-plugging, i.e. plugging transceiver module 22 into electrical connector 24 while electrical power remains applied. With reference to FIG. 8, the longest contact pads 60 make contact first, and the shortest contact pads 60 make contact last. (Note that the shorter contact pads 60 are aligned end-to-end with dummy pads having no electrical connection.) Longer contact pads 60 remain in contact with their complementary contacts 40 while the shorter contact pads 60 make contact with their complementary contacts 40. It is desirable in the art for hot-pluggable connector systems to connect a ground signal first, then connect a power signal, and connect data signals last.

To further secure module 22 to connector 24 when electrical contact is made, module 22 includes a latch having a triangular tab 74 that snaps into a triangular opening 76 in a resilient extension 75 of guide rail 38 in response to relative movement in the Z direction, as illustrated in FIG. 7. To release the latch, the user depresses the resilient extension of guide rail 38 and disengages it from tab 74. The user can then slide module 22 on guide rail 38 away from assembly 20. The mating parts disengage and electrical contact is broken in the reverse manner from that described above.

The connector system of the present invention is easy to use because, from the user's perspective, all of the relative motion between module 22 and assembly 20 is in the Z direction. The camming element of the present invention redirects a part of this motion to the Y direction to inhibit excessive wiping and attendant contact wear, but this redirection is essentially unnoticeable to the user.

In an alternative embodiment, illustrated in FIGS. 11–15 and 18, the connector 80 has a spring clip 82 that provides a combined lock-down and kick-out force. Spring clip 82 is a unitary piece of spring steel or other suitable material that is bent into the following portions: Spring clip 82 has a planar base portion 84 (see, e.g., FIG. 13) abutting the end of the camming block 83. Base portion 84 is preferably aligned with a plane defined by the X-Y axes, i.e., normal to the Z axis, but precision in this alignment is not critical. Spring clip 82 also has two tabs 86 and 88 that extend from the lower area of base portion 84 in the direction of the Z axis. Tabs 86 and 88 can be surface-mounted to the printed circuit board (not shown in FIGS. 11–15 and 18) to provide grounding. Extending from the upper area of base portion 84 in the general direction of the Z axis are two finger-like lock-down members 90 and 92. The distal ends of lock-down members 90 and 92 are cup-shaped or hook-shaped to ease contact with the module (not shown) during connection. In a particularly advantageous embodiment of the invention, in which spring clip 82 is made of spring steel 0.508 mm in thickness, lock-down members 90 and 92 provide a resilient bias force in the Y direction of approximately 15 newtons (N) at 0.68 mm deflection. Two finger-like kick-out members 94 and 96 also extend from base portion 84. Kick-out members 94 and 96 are oriented or bent at an angle of approximately 30 degrees with respect to the Y axis. In an embodiment in which kick-out members 94 and 96 are oriented at this angle and spring clip 82 is made of spring steel 0.508 mm thickness, kick-out members 94 and 96 provide a resilient bias force in the Z direction of approximately 35 N at 0.45 mm deflection.

A somewhat U-shaped brace portion 98 extends from base portion 84 in a direction parallel to the Z axis, then continues in a direction parallel to the Y axis inside the rectangular opening of camming block 83, and then continues in a direction parallel to the Z axis on the underside of camming block 83 in a manner that clips brace portion 98 to camming block 83. Brace portion 98 provides the important function of inhibiting spring clip 82 from twisting or bending backwards in response to the force along the Z axis that spring clip 82 experiences when a module (not shown) is mated, i.e., plugged in.

Figure 12:
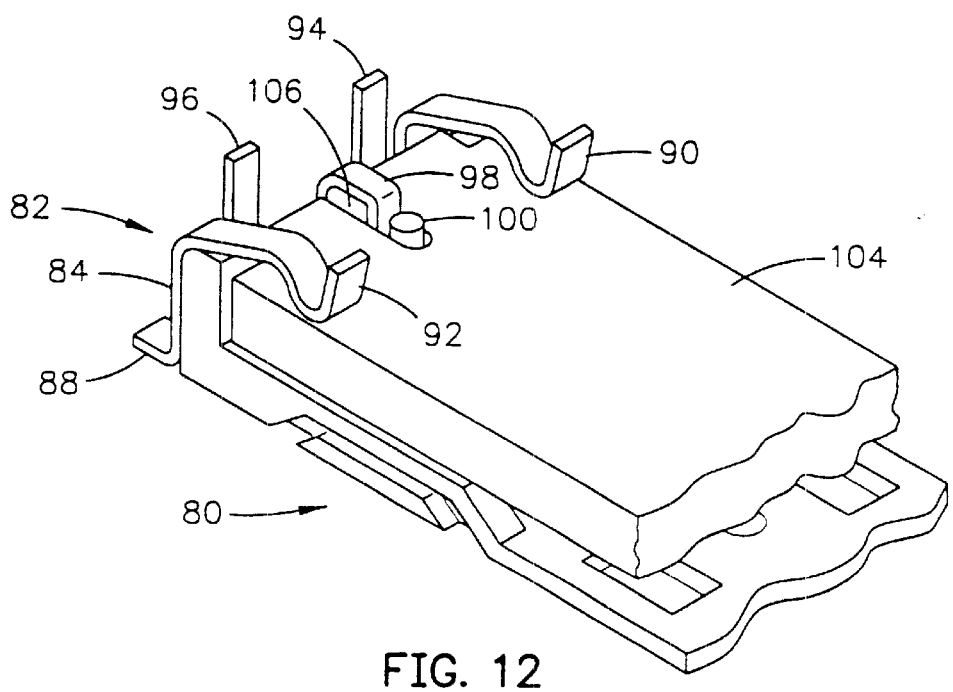
FIG. 12 is a perspective view similar to FIG. 11, showing the mating action between the camming connector and the circuit board portion of the transceiver module.
Figure 13:
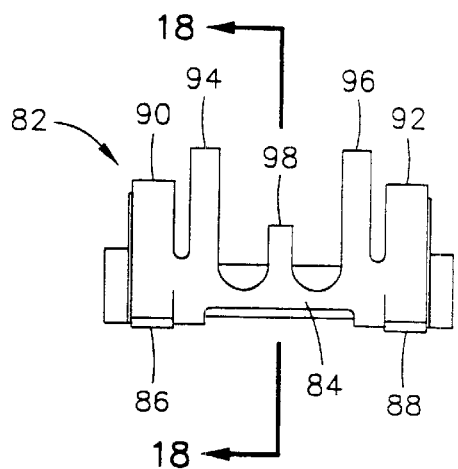
FIG. 13 is an end view of the alternative camming connector.
Figure 18:
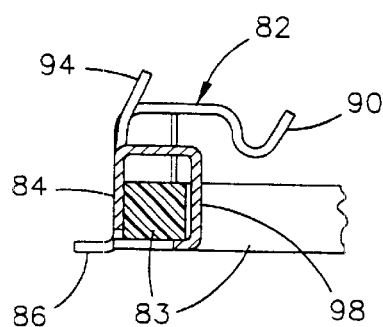
FIG. 18 is a sectional view taken on line 18—18 of FIG. 13.
Figure 14:
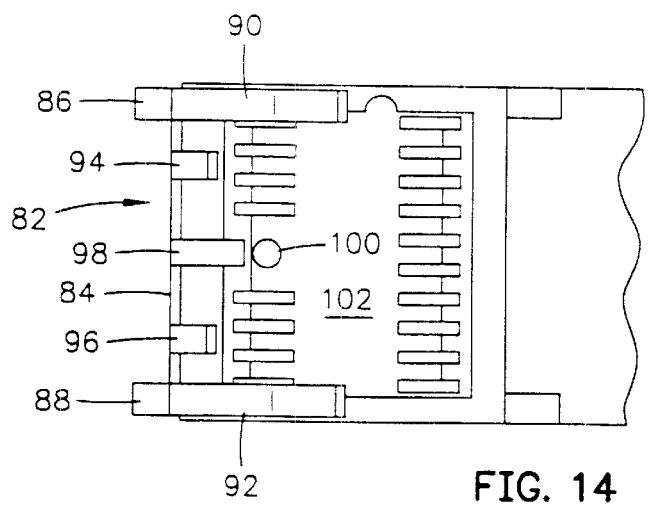
FIG. 14 is a top plan view of the alternative camming connector.
Figure 15:
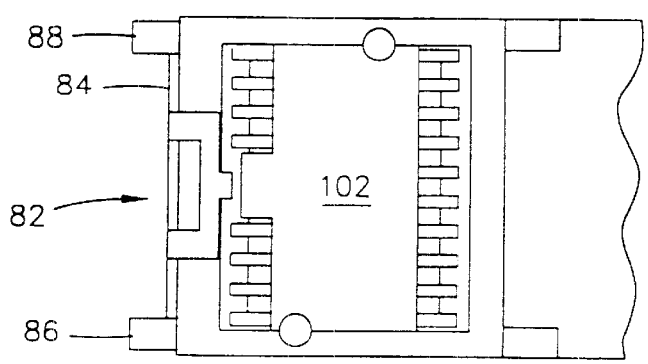
FIG. 15 is a bottom plan view of the alternative camming connector.

This embodiment includes another feature in addition to spring clip 82 that is different from the embodiment described above. An alignment post 100 (protuberance) is formed in the connector block 102 that fits within the rectangular opening in camming block 83. As illustrated in FIG. 12, the circuit board 104 of the module has a corresponding opening or slot 106 (recess). Except as described above, connector 80 is essentially identical to connector 24 of the embodiment described above. Thus. for example, it includes two rows of contacts 108 mounted in connector block 102.

In operation, a user engages a module (not shown) with connector 80 in essentially the same manner illustrated in FIGS. 6A–E with respect to the embodiment described above. But for the existence of slot 106 in circuit board 104, the module can be the same as module 22 of the embodiment described above. Nevertheless, as illustrated in FIG. 12, as the cam begins to lower the module onto contacts 108, post 100 extends into slot 106. Post 100 fits closely within slot 106, thereby aligning circuit board 104 and its module with connector block 102. Importantly, this alignment occurs before the contact pads (not shown) of circuit board 104 make contact with contacts 108. Thus, the pads are aligned with contacts 108 at the time that contact is made. This precision alignment mechanism and alignment-before-contact sequencing allows the contact density to be quite high, which is desirable in many embodiments of the invention.

As the module nears the end of its travel, lock-down members 90 and 92 engage the upper surface of circuit board 104 and make contact with a grounding contact pad (not shown) thereon. Lock-down members 90 and 92 are deflected slightly by circuit board 104, and resiliently bias circuit board 104 downwardly, i.e., in the Y direction, to mechanically secure the module to connector 80 while providing an additional path for coupling the module to electrical ground. Also as the module nears the end of its travel, the end of circuit board 104 deflects kick-out members 94 and 96 in the Z direction. When a latch, such as that described above with respect to another embodiment of the invention, is engaged, the module is retained in the position illustrated in FIG. 12. The then-deflected kick-out members 94 and 96 store potential energy in the resilient manner of a spring. When the latch is released, the deflected kick-out members 94 and 96 release their energy in the form of a force sufficient to eject or kick the module out slightly.

Figure 22:
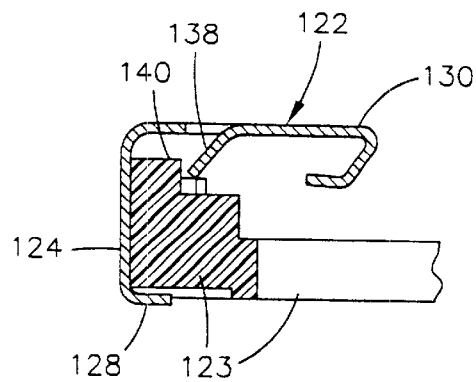
FIG. 22 is a sectional view taken on line 22—22 of FIG. 21.
Figure 23:
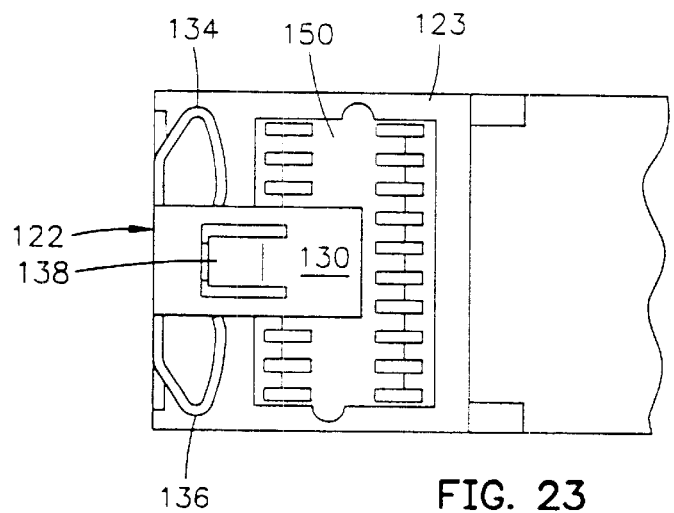
FIG. 23 is a top plan view of the camming connector of FIG. 19.
Figure 24:
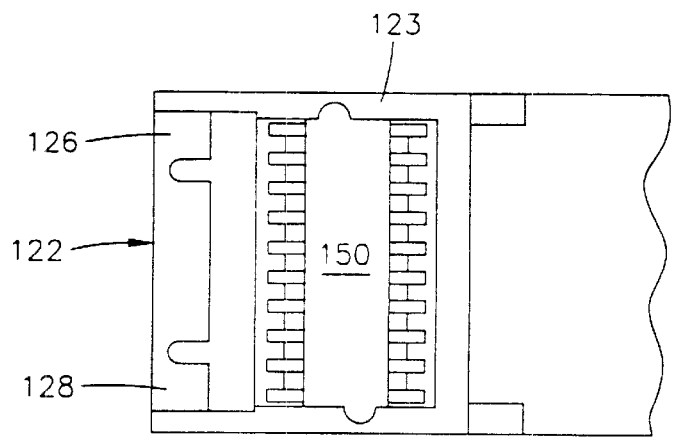
FIG. 24 is a bottom plan view of the camming connector of FIG. 19.

In an alternative embodiment, illustrated in FIGS. 19–24, the connector 120 has a spring clip 122 that provides a combined lock-down and kick-out force. Spring clip 122 is a unitary piece of spring steel or other suitable material that is bent into the following portions: Spring clip 122 has a planar base portion 124 (see. e.g., FIG. 21) abutting the end of the camming block 123. Base portion 124 is preferably aligned with a plane defined by the X-Y axes, i.e., normal to the Z axis, but precision in this alignment is not critical. As illustrated in FIGS. 22 and 24, spring clip 122 also has two tabs 126 and 128 that extend from the lower area of base portion 124 in the direction of the Z axis along the underside of camming block 123. Tabs 126 and 128 can be surface-mounted to the printed circuit board (not shown in FIGS. 19–24) to provide grounding. Extending from the upper area of base portion 124 in the general direction of the Z axis is a lock-down member 130. The distal end of lock-down member 130 is J-shaped or blunted to ease contact with the module (not shown) during connection. In a particularly advantageous embodiment of the invention, in which spring clip 122 is made of spring steel 0.409 mm in thickness, lock-down member 130 provides a resilient bias force in the Y direction of approximately 15 newtons (N) at 0.68 mm deflection. Two generally U-shaped kick-out members 134 and 136 also extend from base portion 124. In an embodiment in which kick-out members 134 and 136 are oriented at this angle and spring clip 122 is made of spring steel 0.409 mm thickness, kick-out members 134 and 136 provide a resilient bias force in the Z direction of approximately 20 N at 0.45 mm deflection.

A barb 138 is formed in a portion of lock-down member 130 that has been cut in a U-shape by bending the portion within the cut downwardly. Camming block 123 as a step-shaped alignment block 140 (protuberance) on its upper surface. The distal end of barb 138 abuts the step to brace spring clip 122 against twisting or bending backwards in response to the force along the Z axis that spring clip 122 experiences when a module (not shown in FIGS. 19–24) is mated, i.e., plugged in.

Figure 20:
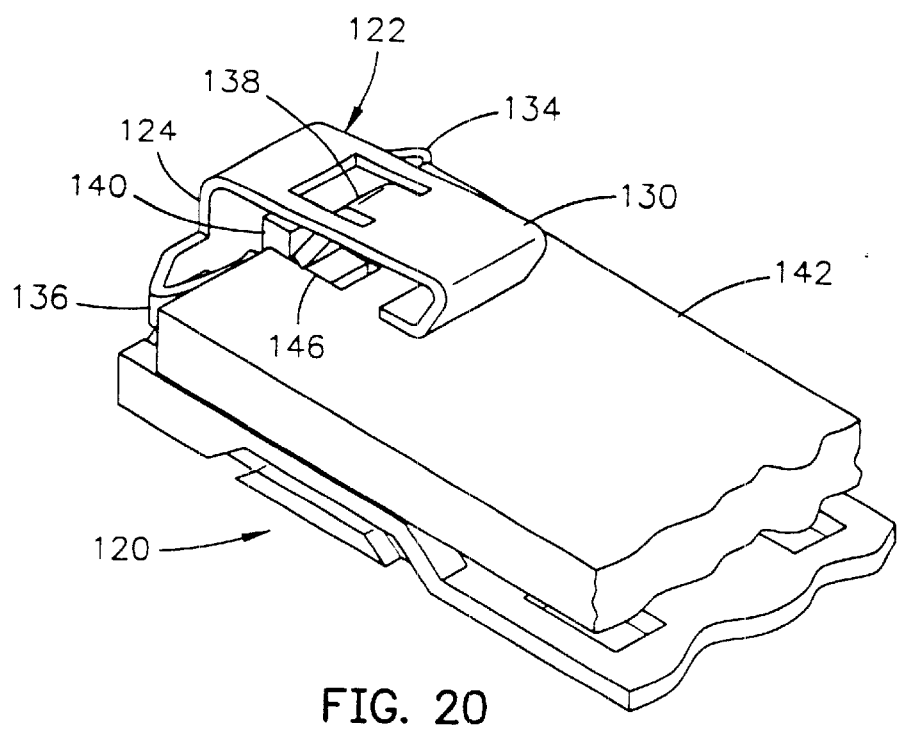
FIG. 20 is a perspective view similar to FIG. 19, showing the mating action between the camming connector and the circuit board portion of the transceiver module.
Figure 21:
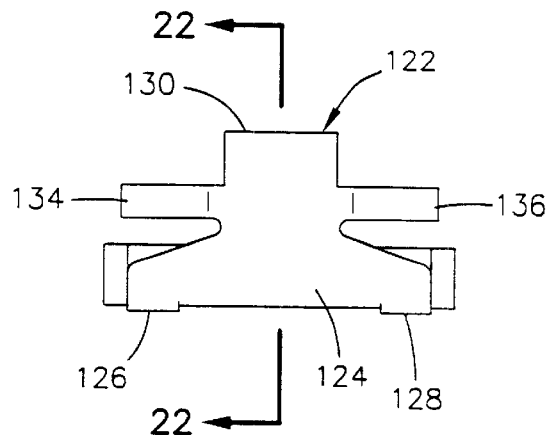
FIG. 21 is an end view of the camming connector of FIG. 19.

As illustrated in FIG. 20, the circuit board 142 of the module has a corresponding opening or slot 146. Except as described above, connector 120 is essentially identical to connector 24 and connector 80 of the embodiments described above. Thus, for example, it includes two rows of contacts 148 mounted in connector block 150.

In operation, a user engages a module (not shown) with connector 120 in essentially the same manner illustrated in FIGS. 6A–E with respect to the embodiments described above. As illustrated in FIG. 20, as the cam begins to lower the module onto contacts 148, alignment block 140 extends into slot 146 (recess), thereby aligning circuit board 142 and its module with connector block 150. As in the embodiment described above, this alignment occurs before the contact pads (not shown) of circuit board 142 make contact with contacts 148. Thus, the pads are aligned with contacts 148 at the time that contact is made.

As the module nears the end of its travel, lock-down member 130 engages the upper surface of circuit board 142 and makes contact with a grounding contact pad (not shown) thereon. Lock-down member 130 is deflected slightly by circuit board 142, and resiliently biases circuit board 142 downwardly, i.e., in the Y direction, to mechanically secure the module to connector 120 while providing an additional path for coupling the module to electrical ground. Also as the module nears the end of its travel, the end of circuit board 142 deflects portions of kick-out members 134 and 136 in the Z direction. When a latch, such as that described above with respect to another embodiment of the invention, is engaged, the module is retained in the position illustrated in FIG. 20. The then-deflected kick-out members 134 and 136 store potential energy in the resilient manner of a spring. When the latch is released, the deflected kick-out members 134 and 136 release their energy in the form of a force sufficient to eject or kick the module out slightly.

Figure 16:
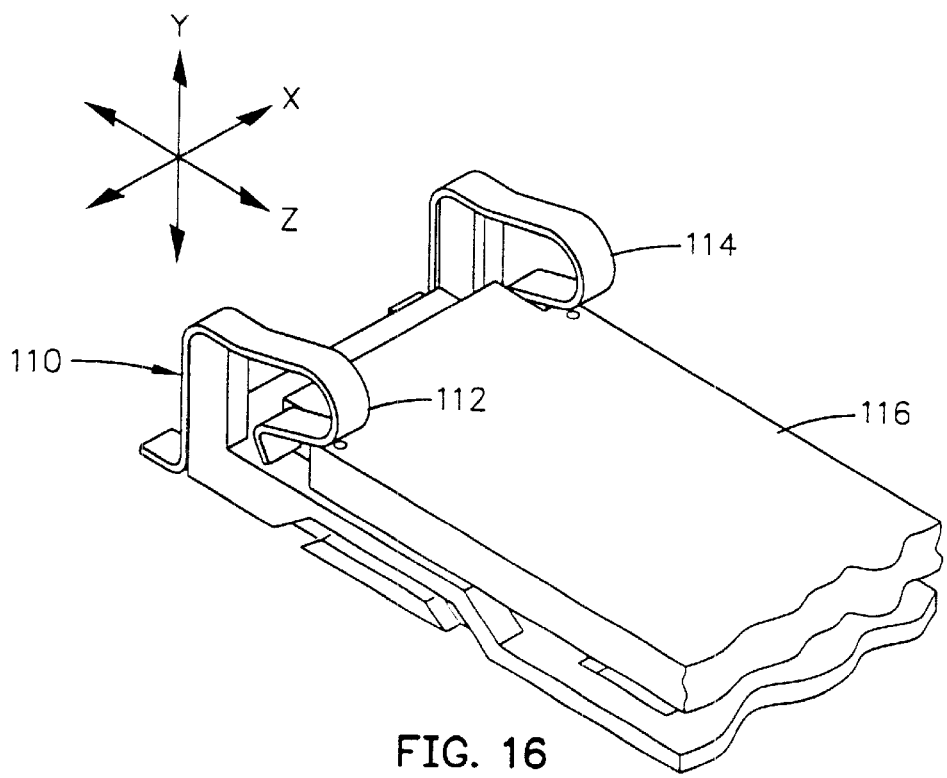
FIG. 16 is a perspective view of another alternative camming connector, showing the beginning of the mating action between the camming connector and the circuit board portion of the transceiver module.
Figure 17:
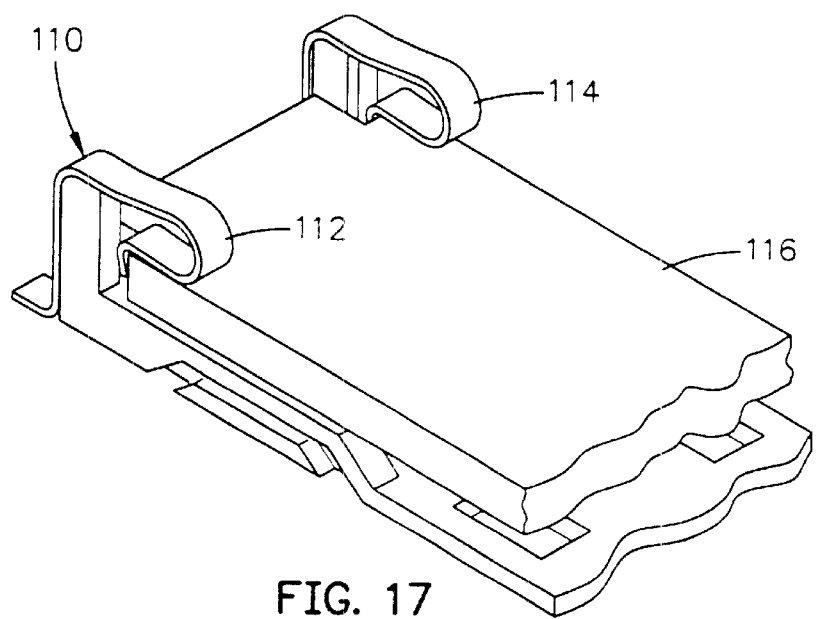
FIG. 17 is a perspective view similar to FIG. 16, showing the end of the mating action.
Figure 19:
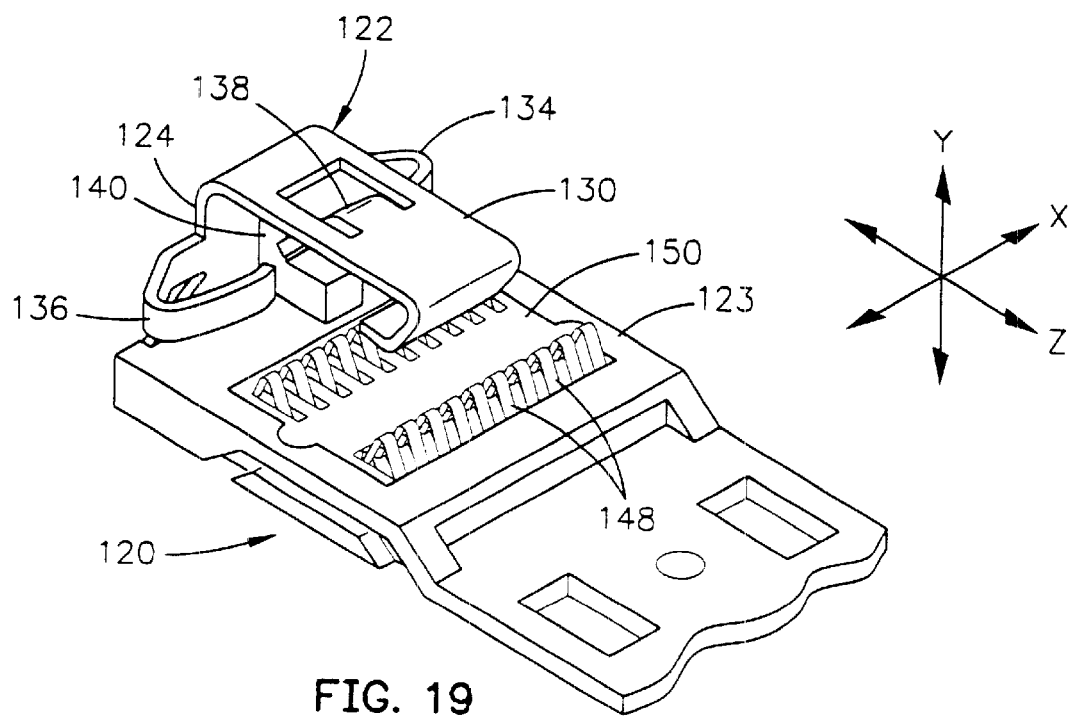
FIG. 19 is a partial perspective view of still another alternative camming connector having a combined lock-down and kick-out spring clip.

As illustrated in FIGS. 16 and 17, in still another alternative embodiment of the invention, the spring clip 110 is similar to spring clip 82 in function, but its lock-down and kick-out functions are combined in only two members 112 and 114. In other words, rather than four members, two of which provide a lock-down function and two of which provide a kick-out function, there are only two members 112 and 114, each of which provides both a lock-down function and a kick-out function. As illustrated in FIG. 16, when a module (not shown) is plugged in, its circuit board 116 deflects the distal ends of members 112 and 114 partially in the Y direction and partially in the Z direction. Deflection in the Y direction provides the lock-down force, and deflection in the Z direction provides the kick-out force, in a manner similar to that in which spring clip 82 of the embodiment described above provides such forces.

It will be evident that there are numerous embodiments of the present invention, which, while not specifically described above, are clearly within the scope and spirit of the invention. Consequently, the above description is considered to be exemplary only, and the full scope of the invention is to be determined solely by the appended claims.

What is claimed is:

1. An electrical connector, comprising:

a body definable with respect to mutually perpendicular first, second and third axes and having a guide member elongated along said first axis between a first end and a second end, said body having a connector block at said first end and having an upper surface and a lower surface oriented in opposed relation along said third axis, and said connector block having a camming element that, in response to a force experienced by said camming element along said first axis, redirects said force in a direction having a component along said third axis and toward said lower surface;

a plurality of contacts retained in said connector block, each contact having an upper portion and a lower portion oriented generally in opposed relation along said third axis, said upper portion disposed at said upper surface of said body and resiliently deflectable in substantially the direction of said third axis, said lower portion disposed at said lower surface of said body for surface-mounting to contact pads of a printed circuit card; and a spring clip disposed at said first end of said body for engaging a portion of a mating connector, said spring clip having a resiliently deflectable lock-down portion unitarily formed with a resiliently deflectable kick-out portion, said lock-down portion spaced above said upper surface of said body and resiliently deflectable in a direction of said third axis by said portion of said mating connector, said kick-out portion resiliently deflectable in a direction of said first axis by said portion of said mating connector.

2. The electrical connector claimed in claim 1, wherein:

said lock-down portion and said kick-out portion are unitarily formed with a substantially planar base portion of said spring clip, said base portion is substantially aligned with a plane parallel to said second and third axes;

said lock-down portion has an elongated, finger-like shape and extends away from said base portion toward said second end of said body in a direction substantially aligned with said first axis; and said kick-out portion has an elongated finger-like shape and extends away from said base portion toward said second end of said body in a direction oriented at an angle between said first and third axes.

3. The electrical connector claimed in claim 2, wherein said spring clip comprises two of said lock-down portions spaced along said second axis on opposite sides of said body.

4. The electrical connector claimed in claim 3, wherein said spring clip comprises two of said kick-out portions spaced along said second axis between said lock-down portions.

5. The electrical connector claimed in claim 2, wherein said spring clip further comprises a generally C-shaped brace portion unitarily formed with said lock-down portion, said kick-out portion and said base portion, said brace portion having an end extending away from said base portion toward said second end of said body in a direction substantially aligned with said first axis and secured to said base portion.

6. The electrical connector claimed in claim 2, further comprising tabs unitarily formed with said base portion for surface-mounting to contact pads of a printed circuit card.

7. The electrical connector claimed in claim 1, wherein:

said lock-down portion and said kick-out portion are unitarily formed with a substantially planar base portion of said spring clip, said base portion is substantially aligned with a plane parallel to said second and third axes;

said lock-down portion has an elongated, finger-like shape and extends away from said base portion toward said second end of said body in a direction substantially aligned with said first axis; and said kick-out portion is substantially U-shaped and extends away from said base portion toward said second end of said body.

8. The electrical connector claimed in claim 7, wherein said spring clip comprises two of said kick-out portions spaced along said second axis on opposite sides of said lock-down portion.

9. The electrical connector claimed in claim 7, wherein said spring clip further comprises a barb portion unitarily formed with said lock-down portion, said kick-out portion and said base portion, said barb portion having an end extending away from said lock-down portion toward said body in a direction between said first and third axes and contacting a protuberance on said body.

10. An electrical connector system, comprising:

a first electrical connector having a body definable with respect to mutually perpendicular first, second and third axes and having a guide member elongated along said first axis between a first end and a second end, said body having a connector block at said first end, said connector block retaining a plurality of electrical contacts;

a second electrical connector having a body slideably engageable with said first electrical connector in a direction along said first axis, said second electrical connector having a plurality of contacts;

a camming element integral to one of said first and second electrical connectors that, in response to a force experienced by said camming element along said first axis, redirects said force in a direction having a component along said third axis to move said contacts of one of said first and second electrical connectors into electrical contact with said contacts of the other of said first and second electrical connectors; and one of said first and second electrical connectors having a protuberance extending in a direction of said third axis when said first electrical connector is engaged with said second electrical connector, and another of said first and second electrical connectors having a recess oriented in a direction of said third axis when said first electrical connector is engaged with said second electrical connector, and said protuberance extends into said recess when said first electrical connector engages said second electrical connector.

11. The electrical connector system claimed in claim 10, wherein when said first and second electrical connectors engage one another said protuberance extends into said recess before said contacts of said first and second electrical connectors move into electrical contact with one another.

12. The electrical connector system claimed in claim 10, wherein:

said protuberance extends along said third axis away from said body first electrical connector; and said second electrical connector has a circuit card on which said electrical contacts are disposed, and said recess is a slot-like opening in said circuit card.

13. A method for connecting a first electrical connector to a second electrical connector in a connector system, a first electrical connector having a body definable with respect to mutually perpendicular first, second and third axes and having a guide member elongated along said first axis between a first end and a second end, said body having a connector block at said first end, said connector block retaining a plurality of electrical contacts, said first electrical connector having a spring clip disposed at said first end of said body, said second electrical connector having a body and a plurality of electrical contacts, one of said first and second electrical connectors having a camming element, the method comprising the steps of:

sliding said body of said first electrical connector into engagement with said body of said second electrical connector along said first axis until said camming element redirects one of said first and second electrical connectors with respect to the other in a direction along said third axis and said plurality of electrical contacts of said mating connector make electrical contact with said plurality of electrical contacts of said second electrical connector;

said second electrical connector resiliently deflecting a lock-down portion of said spring clip while said bodies of said first and second electrical connectors slide into engagement, said lock-down portion exerting a bias force against said second electrical connector in a direction along said third axis toward said body of said first electrical connector;

said second electrical connector resiliently deflecting a kick-out portion of said spring clip while said bodies of said first and second electrical connectors slide into engagement, said kick-out portion exerting a bias force against said second electrical connector in a direction along said first axis toward said second end of said body of said first electrical connector.

14. The method claimed in claim 13, wherein said step of said second electrical connector resiliently deflecting a lock-down portion of said spring clip comprises deflecting two elongated, finger-like lock-down portions in a direction along said third axis and away from said body of said first electrical connector.

15. The method claimed in claim 13, wherein said step of said second electrical connector resiliently deflecting a kick-out portion of said spring clip comprises deflecting two elongated, finger-like kick-out portions in a direction having a component along said second axis and toward said first end of said body of said first electrical connector.

16. The method claimed in claim 15, further comprising the steps of:

sliding said body of said first electrical connector into engagement with said body of said second electrical connector along said first axis until a first latch portion of said body of said first electrical connector engages a second latch portion of said body of said second electrical connector, engagement of said first and second latch portions resisting separation of said first and second electrical connectors in response to said bias force along said first axis; and releasing said first and second latch portions from engagement; and said bias force along said first axis moving said second electrical connector in a direction along said second axis in response to releasing said first and second latch portions from engagement.

17. A method for connecting a first electrical connector to a second electrical connector in a connector system, a first electrical connector having a body definable with respect to mutually perpendicular first, second and third axes and having a guide member elongated along said first axis between a first end and a second end, said body having a connector block at said first end, said connector block retaining a plurality of electrical contacts, said first electrical connector having a protuberance disposed at said first end of said body, said second electrical connector having a body with a recess and a plurality of electrical contacts, one of said first and second electrical connectors having a camming element, the method comprising the steps of:

sliding said body of said first electrical connector into engagement with said body of said second electrical connector along said first axis until said camming element redirects one of said first and second electrical connectors with respect to the other in a direction along said third axis and said plurality of electrical contacts of said mating connector make electrical contact with said plurality of electrical contacts of said second electrical connector; and said protuberance moving into said recess when said camming element redirects one of said first and second electrical connectors with respect to the other in a direction along said third axis and before said plurality of electrical contacts of said mating connector make electrical contact with said plurality of electrical contacts of said second electrical connector, and said protuberance remains in said recess after said plurality of electrical contacts of said mating connector have made electrical contact with said plurality of electrical contacts of said second electrical connector.

* * * * *